United States Patent
Sato

(10) Patent No.: US 7,915,602 B2
(45) Date of Patent: Mar. 29, 2011

(54) PHASE CHANGE MEMORY DEVICE AND FABRICATION METHOD THEREOF

(75) Inventor: Natsuki Sato, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 200 days.

(21) Appl. No.: 12/379,825

(22) Filed: Mar. 3, 2009

(65) Prior Publication Data

US 2009/0218557 A1   Sep. 3, 2009

(30) Foreign Application Priority Data

Mar. 3, 2008 (JP) ................................. 2008-051946

(51) Int. Cl.
- H01L 47/00 (2006.01)
- H01L 29/66 (2006.01)
- H01L 21/70 (2006.01)
- H01L 21/02 (2006.01)

(52) U.S. Cl. ............ 257/4; 257/343; 257/377; 257/382; 257/E29.12; 257/E29.121; 257/E29.258

(58) Field of Classification Search .............. 257/4, 343, 257/377, 382, E29.12, E29.121, E29.258
See application file for complete search history.

(56) References Cited

U.S. PATENT DOCUMENTS

| | | | | |
|---|---|---|---|---|
| 6,147,395 | A * | 11/2000 | Gilgen | 257/529 |
| 6,534,368 | B2 * | 3/2003 | Zahorik | 438/275 |
| 6,670,628 | B2 | 12/2003 | Lee et al. | |
| 7,012,273 | B2 * | 3/2006 | Chen | 257/4 |
| 7,049,623 | B2 * | 5/2006 | Lowrey | 257/3 |
| 7,374,174 | B2 * | 5/2008 | Liu et al. | 257/5 |
| 7,394,087 | B2 * | 7/2008 | Kuh et al. | 257/2 |
| 7,488,981 | B2 * | 2/2009 | Jeong et al. | 257/68 |
| 7,498,064 | B2 * | 3/2009 | Horii | 427/554 |
| 7,554,144 | B2 * | 6/2009 | Lai et al. | 257/295 |
| 7,569,846 | B2 * | 8/2009 | Choi et al. | 257/4 |
| 7,692,176 | B2 * | 4/2010 | Ha et al. | 257/4 |
| 7,704,787 | B2 * | 4/2010 | Hideki et al. | 438/102 |
| 7,835,177 | B2 * | 11/2010 | Hsu et al. | 365/163 |
| 2006/0138473 | A1 | 6/2006 | Kawagoe et al. | |

FOREIGN PATENT DOCUMENTS

| | | |
|---|---|---|
| JP | 2003-332529 A | 11/2003 |
| JP | 2006-179778 A | 7/2006 |

* cited by examiner

*Primary Examiner* — Ida M Soward
(74) *Attorney, Agent, or Firm* — Foley & Lardner LLP

(57) ABSTRACT

A phase change memory device is provided in which the area of contact between phase change material and heater electrode is reduced to suppress current required for heating and a phase change region is formed directly on a contact to raise the degree of integration. The device comprises a heater electrode in which the lower part thereof is surrounded by a side wall of a first insulating material and the upper part thereof protruding from the side wall has a sharp configuration covered by a second insulating material except for a part of the tip end thereof, and the exposed tip end is coupled to the phase change material layer.

9 Claims, 7 Drawing Sheets

PHASE CHANGE MEMORY DEVICE AND FABRICATION METHOD THEREOF

BACKGROUND OF THE INVENTION

1. Field of the Invention

The present invention relates to a phase change memory device and fabrication method thereof, and more particularly to improvement of heater electrode configuration for heating a phase change material.

2. Description of Related Art

For nonvolatile memories widely used as information storage means in mobile-phones and the like, a phase change random access memory (hereinafter referred to as PRAM) which uses the change of resistance value of phase change material has been developed (refer to Japanese Patent Laid-Open Nos. 2006-179778 and 2003-332529).

FIG. 13 illustrates a memory cell structure (cross-sectional view) of a conventional PRAM. An MOS transistor and a storage device with phase change material are formed on semiconductor substrate 31.

Reference numeral 32 denotes a gate electrode of the transistor, and diffusion layers 33 and 34 doped with n-type impurity function as source and drain regions of the transistor. Gate electrode 32 functions as a word line for memory cell selection.

Interlayer insulating film 35 is formed on the gate electrode. Heater electrode 38 is connected to diffusion layer 33. Phase change material layer 39 is formed on heater electrode 38, and upper electrode 40 is formed on phase change material layer 39.

When current applys to heater electrode 38, heater electrode 38 generates heat and thus phase change material layer 39 is partially heated. This heating causes phase change in the vicinity of phase boundary between phase change material layer 39 and heater electrode 38, and thus a change in series electrical resistance occurs. In this case, the region where the phase change occurs is illustrated as phase change region 41 in FIG. 13.

Ground (GND) line 37 is connected via contact plug 36 to another diffusion layer 34 of the transistor.

A storage device is comprised of heater electrode 38, phase change material layer 39 and upper electrode 40, and the storage device is connected via the MOS transistor to the GND line, whereby one memory cell is constructed.

With GND line 37 connected to the ground and the transistor in an ON state, when a pulse voltage is applied to upper electrode 40, electric current flows in a current path including upper electrode 40, phase change material layer 39, heater electrode 38, diffusion layer 33, transistor channel, diffusion layer 34 and GND line 37. Such a passage of electric current causes generation of heat (Joule heat) in heater electrode 38 and thus phase change material layer 39 is partially heated, causing phase change. As a result, a change in electrical resistance value occurs. By controlling the heating proceeding, the phase change material can be set to a crystalline state (Set state) having a low resistance or a noncrystalline state (Reset state) having a high resistance. After the completion of heating, the state can be maintained. Consequently, data can be recorded (held) in a desired memory cell by using the change in electrical resistance.

In the related art of FIG. 13, heater electrode 38 is directly connected to diffusion layer 33. As a material for the heater electrode, tungsten (W) or the like can be used; but in order to implement ohmic contact with the diffusion layer, for example, titanium (Ti) is deposited on a lowermost layer part, and subsequently titanium nitride (TiN) acting as barrier metal is deposited thereon, and then tungsten for infilling is deposited thereon. When the area of contact between phase change material layer 39 and heater electrode 38 is reduced, the current density increases to improve the heating efficiency. In the structure of FIG. 13, however, since the depth of the heater electrode is increased, it is difficult to form a small heater electrode diameter under processing constraints. Accordingly, a large amount of current has to be provided for causing phase change. Consequently, the current ability of the transistor had to be raised. Thus, the size of the transistor increases, leading to an increase in cell size. Furthermore, consumption current also increases.

FIG. 14 illustrates a memory cell structure of another conventional PRAM in which improvements have been made for the above problems.

Referring to FIG. 14, heater electrode 38 of FIG. 13 is replaced with a stacked structure of contact plug 42 and heater electrode 46. Contact plug 42 is, similarly to heater electrode 38 of FIG. 13, formed of three layers of titanium, titanium nitride and tungsten. Heater electrode 46 is formed of tungsten or the like, and connected to an upper part of contact plug 42. With this structure, the height of heater electrode 46 can be set lower than the structure of FIG. 13 and thus the heater diameter can be set smaller. However, the heater diameter is limited by the resolution of photolithography in patterning. Thus, there is known an approach in which, in order to form a heater electrode of a smaller diameter, side wall 45 is formed in a side surface of opening 44 for heater electrode by use of insulating film made of, for example, silicon nitride and tungsten is filled inside the side wall.

Here, even when opening 44 is patterned by photolithography and thereafter side wall 45 is formed using an insulating film so that the heater diameter is reduced, the thickness of the side wall is limited by the bottom diameter of opening 44. This is originated in that, when opening 44 for heater electrode and side wall 45 are formed by anisotropic dry etching, in the case of microscopic contact hole, it is difficult to form a perfectly perpendicular side surface. More specifically, the side surface of opening 44 has a tapered shape, thereby becoming the bottom diameter smaller than the upper diameter. Consequently, the film thickness of side wall 45 should be reduced so that the bottom of opening 44 is not closed. Accordingly, it is difficult to reduce the upper part diameter of heater electrode 46 to a desired size.

In the related art of FIGS. 13 and 14, it is difficult to form the heater electrode so that the size thereof is smaller than a given size, and thus phase change region 41 is formed in contact with a planar part on the heater electrode. Accordingly, heat and current (electron) diffuses (the arrow indicated by "H") toward the upper electrode and thus the current density does not increase. Consequently, the heating efficiency of the heater electrode is low; in order to reach a desired temperature, a large amount of current was needed. Further, since the planar upper surface of the heater electrode is in contact with the phase change material, phase change region 41 also extends widely. Accordingly, heat amount to be added till the completion of the phase change increases to cause the phase change in a large area. This is also a factor of increasing an amount of the applied current.

In contrast, Japanese Patent Laid-Open No. 2003-332529 describes a structure in which a combined electrode is formed by arranging a conductive material to cover dielectric mandrel being regular pyramid-shaped or cone-shaped insulator, and only the peak of the combined electrode is made to protrude from the dielectric layer covering the combined electrode, so that the area of contact between phase change material and heater electrode is reduced. However, this structure includes the dielectric mandrel, and thus phase change region cannot be formed directly on a contact from a transistor formed in the lower part. As a result, the degree of integration cannot be raised, so it is difficult to reduce the chip size of device.

Thus, there are demands for a phase change memory device in which the contact area between phase change material and heater electrode can be reduced to suppress current required for heating and also the phase change region can be formed directly on the contact to raise the degree of integration.

SUMMARY

According to one exemplary embodiment, there is provided a phase change memory device including:

a phase change material layer;

a heater electrode having a lower part and an upper part, and the lower part surrounded by a first insulating layer and the upper part protruding the first insulating layer and having a sharp configuration and a tip end coupled to the phase change layer.

In the memory cell of phase change memory, the upper part of the heater electrode has a sharp configuration, and only the tip end thereof is in contact with the phase change material. Accordingly, the heating efficiency of the phase change material layer by the heater electrode improves, and thus current required for heating can be suppressed.

Further, in the memory cell, the heater electrode is connected to a source or drain region of transistor via a contact plug. Consequently, when a material having a higher resistance than a conductive material forming the contact plug is used only for the heater electrode, the heating efficiency is further improved.

The present invention allows suppressing of current required for heating the phase change material. Consequently, current consumption reduction and memory cell transistor size reduction (chip area reduction) can be accomplished.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Particularly, the second insulating material covering the sharp configuration of the heater electrode may be formed in a configuration of side wall on the side surface of the sharp configuration on the side wall composed of the first insulating material, or formed on the whole upper surface of the side wall composed of the first insulating material.

Preferably, the phase change memory device of the present invention may include: a contact plug coupled between a bottom of the heater electrode and an active switching device, such as a transistor; and an upper electrode in contact with an upper surface of the phase change material layer, and the heater electrode may be constructed using a material having a greater resistance than the contact plug to raise the heating efficiency.

The invention will be now described herein with reference to illustrative embodiments. Those skilled in the art will recognize that many alternative embodiments can be accomplished using the teachings of the present invention and that the invention is not limited to the embodiments illustrated for explanatory purpose.

Figure 9:
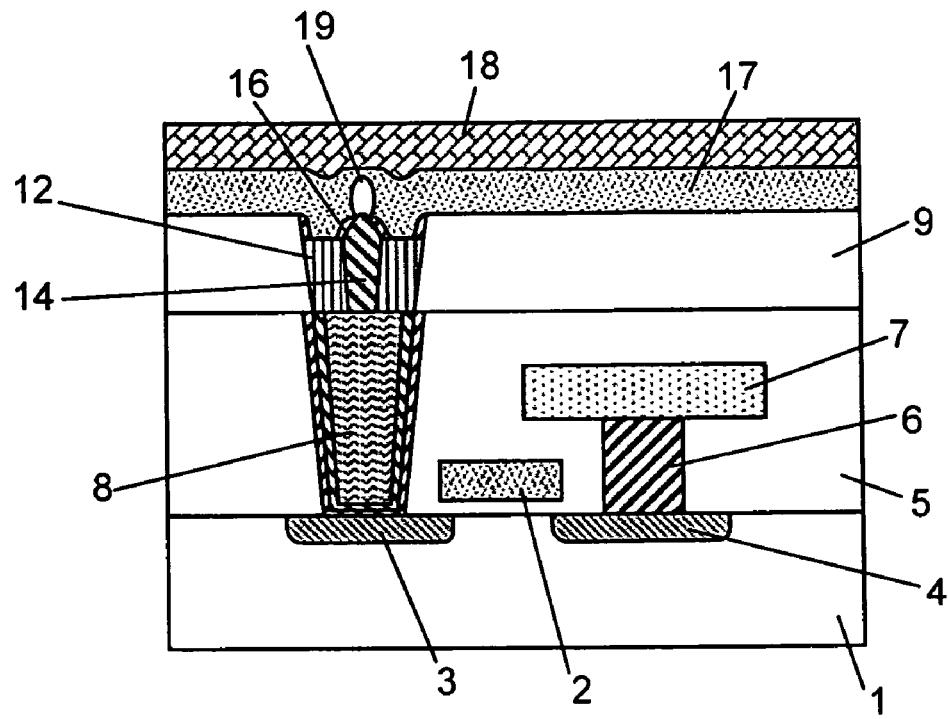
FIG. 9 is a sectional view for describing the phase change memory device according to the one exemplary embodiment of the present invention.

FIG. 9 is a sectional view of a PRAM memory cell according to one exemplary embodiment. An MOS transistor acting as an active switching device is formed on p-type semiconductor substrate 1. Gate electrode 2 of the transistor functions as a word line for memory cell selection. Diffusion layer regions 3 and 4 contain n-type impurity such as phosphorus and function as a source and drain regions of the transistor, respectively. Contact plug 8 is connected to diffusion layer region 3. Ground (GND) line 7 is connected via contact plug 6 to diffusion layer region 4. Heater electrode 14 is arranged in contact with contact plug 8. The upper part of heater electrode 14 has a sharpened configuration (sharp configuration) and only the tip end thereof is in contact with phase change material layer 17. Upper electrode 18 is arranged in contact with phase change material layer 17 on an upper surface of phase change material layer 17. When phase change material layer 17 is heated by heater electrode 14, phase change occurs in region 19 (phase change region), so that the electrical resistance varies.

With GND line 7 connected to the ground and the transistor in an ON state, when a pulse-shaped voltage is applied to the upper electrode, current can flow from upper electrode 18 via phase change material layer 17 and heater electrode 14 to ground line 7. This current causes heater electrode 14 to generate heat.

Heater electrode 14 has a sharpened configuration in its upper part, and the side surface thereof except for a part of the tip end thereof is covered with side wall 16 using insulating film. Consequently, only the microscopic region being a part of the sharpened tip end in the upper part of heater electrode 14 functions as a heater in contact with phase change material layer 17. Accordingly, the current concentrates in the tip end of heater electrode 14, so the current density increases and thus the heating efficiency improves. This allows lowering of the current value required for causing phase change. Consequently, it is possible to cause phase change using small current. Also, phase change region 19 formed in this way is smaller than the region according to related art.

A fabrication method of PRAM according to a first exemplary embodiment will be described below.

Figure 1:
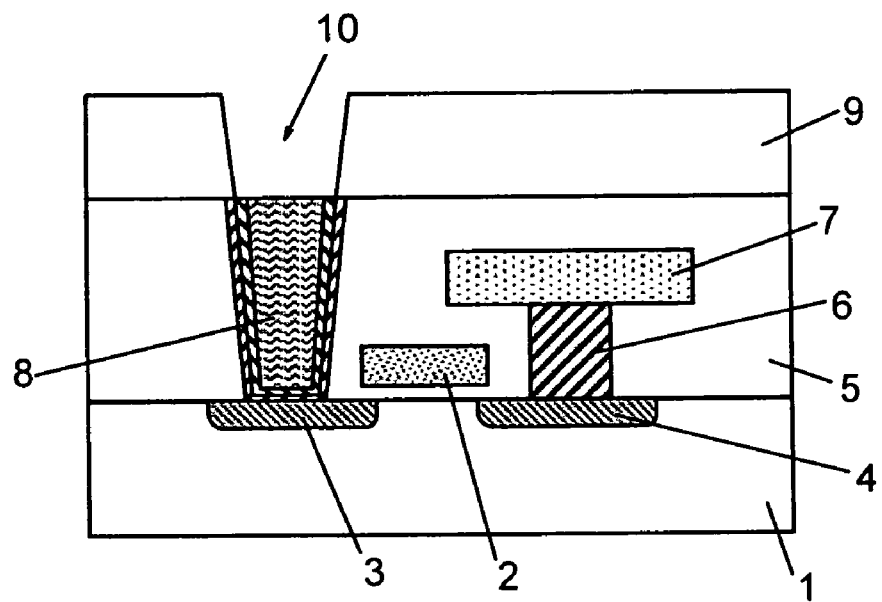
FIGS. 1 to 8 are each a sectional view for describing steps in a fabrication method of a phase change memory device according to one exemplary embodiment of the present invention.

First, as illustrated in FIG. 1, gate electrode 2 of the MOS transistor, diffusion layer regions 3 and 4, interlayer insulating film 5, contact plugs 6 and 8, and ground line 7 are, using known means, formed on semiconductor substrate 1. Contact plugs 6 and 8 are formed of three layers of titanium, titanium nitride and tungsten stacked upwardly in this order. The surface of contact plug 8 is flattened by CMP (Chemical Mechanical Polishing).

Interlayer insulating film 9 is formed on contact plug 8 by use of silicon oxide film ($SiO_2$) or the like and thereafter opening 10 for forming the heater electrode is arranged.

Figure 2:
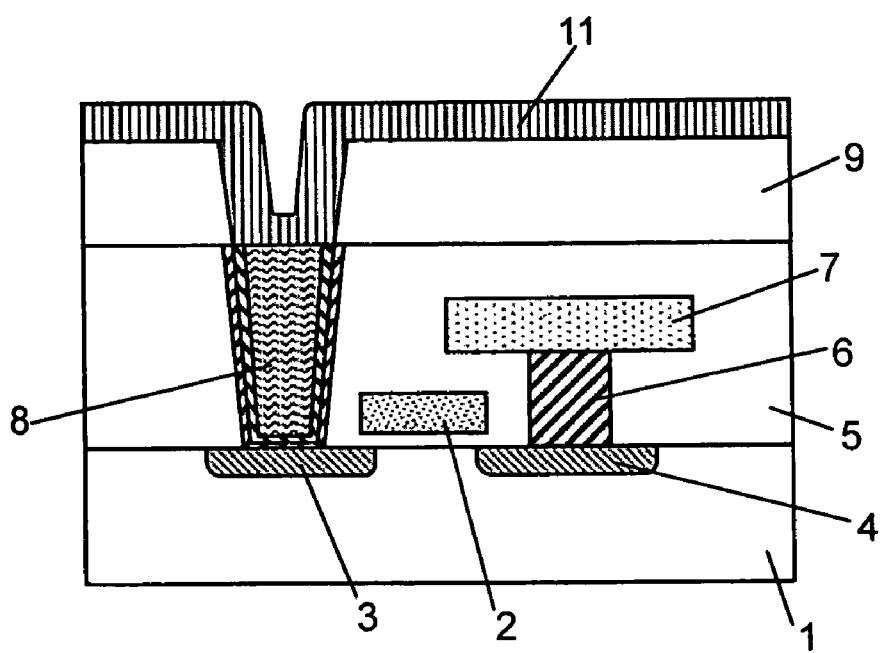

Subsequently, as illustrated in FIG. 2, insulating film 11 is formed using a first insulating material such as silicon nitride film ($Si_3N_4$)). The thickness of insulating film 11 is set so that opening 10 is not completely filled.

Figure 3:
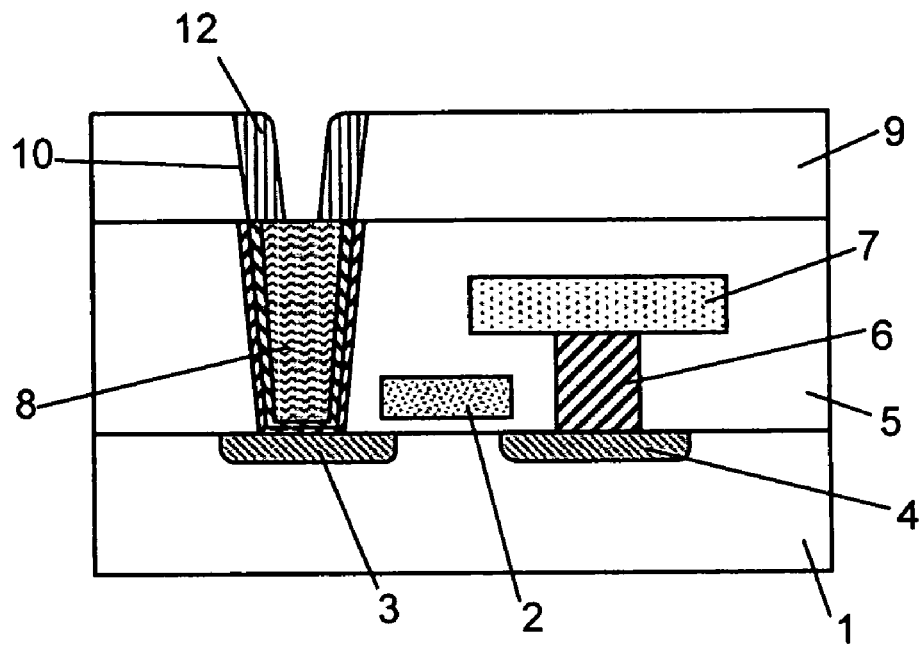

Next, as illustrated in FIG. 3, anisotropic dry etching is subjected to insulating film 11 to form side wall 12 on a side surface of opening 10.

Figure 4:
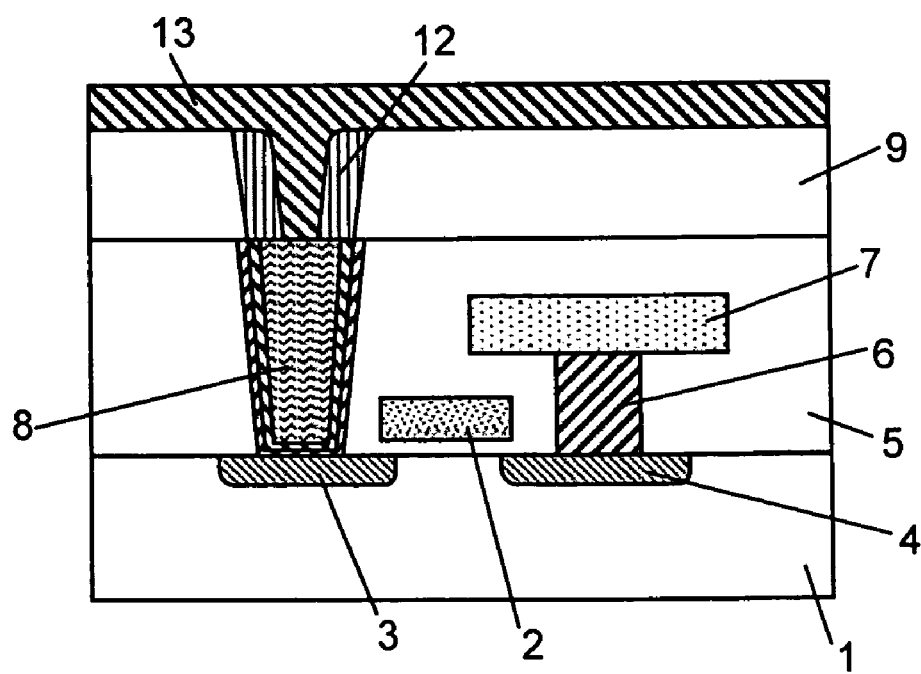

Subsequently, as illustrated in FIG. 4, for example, tungsten film is deposited as heater electrode material 13 to fill a void surrounded by side wall 12.

Figure 5:
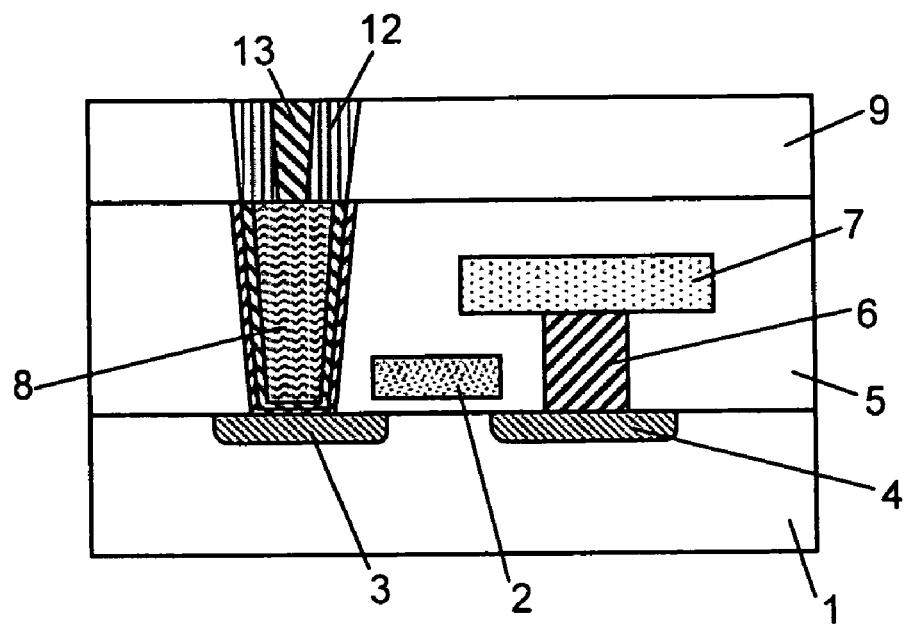

As illustrated in FIG. 5, heater electrode material 13 is polished by CMP to expose an upper surface of side wall 12, whereby a smooth surface is formed.

Figure 6:
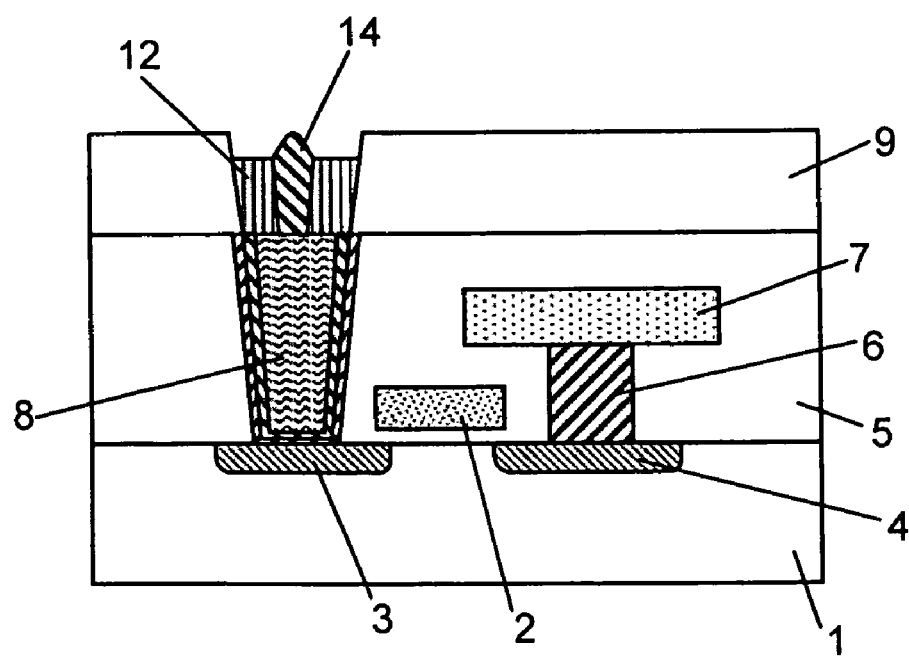

Subsequently, as illustrated in FIG. 6, side wall 12 is partly removed by anisotropic dry etching to lower the surface of side wall 12. In this case, the dry etching conditions are set so that the speed of etching silicon nitride film forming side wall 12 is higher than the speed of etching tungsten forming heater material 13 and silicon oxide film forming interlayer insulating film 9.

More specifically, the etching speed ratio (selection ratio) between silicon oxide film ($SiO_2$) and silicon nitride film ($Si_3N_4$) is set so that $SiO_2:Si_3N_4=1:10$, for example. Further, the etching speed ratio between tungsten (W) and silicon nitride film ($Si_3N_4$) is set so that $W:Si_3N_4=1:5$ to $1:7$. Under such processing conditions, the silicon nitride film of side wall 12 is removed approximately 50 nm by etching, so that a recess is formed. In this case, interlayer insulating film 9 is etched only about 5 nm. Also, heater material 13 is removed only about 7 to 10 nm. Consequently, heater material 13 has a configuration in which the upper part of heater material 13 protrudes from side wall 12. In addition, as heater material 13 increasingly protrudes from side wall 12 during etching, etching gas ion also collides with a side surface of heater material 13 and thus removal by etching also continues in the side surface of the heater material. The upper side surface of heater material 13 comes to have a longer time exposed to etching gas compared with the lower side surface thereof. Consequently, a tapered configuration is formed in which the diameter of the upper part is smaller than that of the lower part. The void surrounded by side wall 12 for filling heater material 13 is very small, for example, 50 to 60 nm in diameter, so finally heater electrode 14 is formed which has a configuration with its tip end sharpened (sharp configuration).

Figure 7:
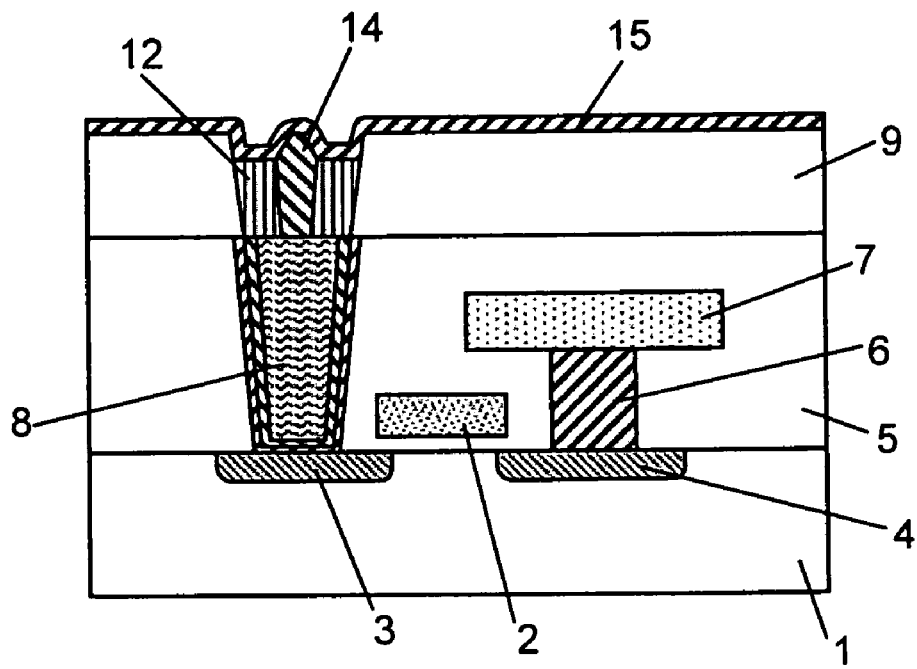

Subsequently, as illustrated in FIG. 7, a second insulating material such as silicon nitride is deposited approximately 10 nm to form insulating film 15.

Figure 8:
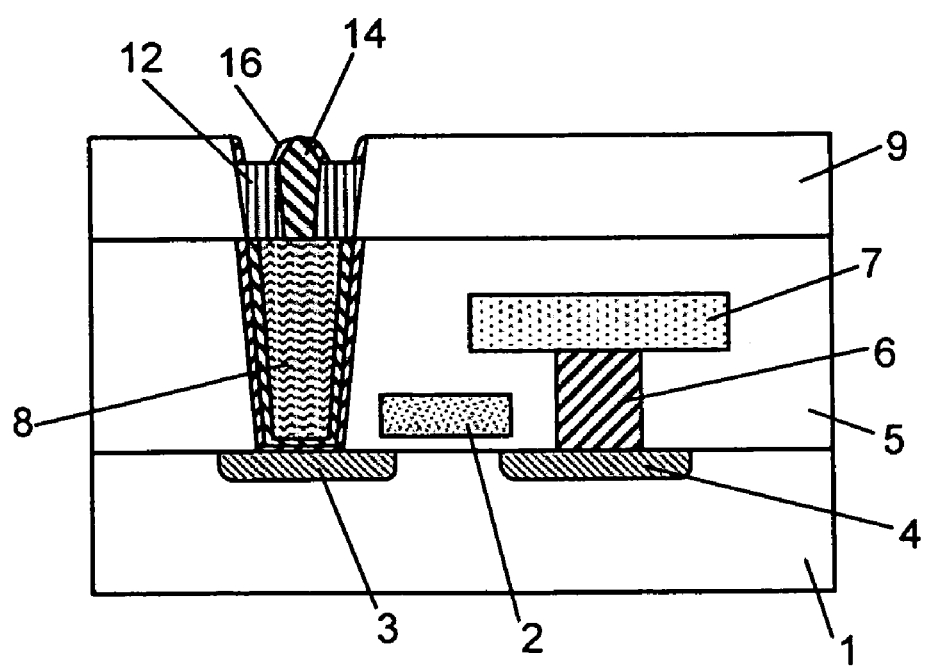

Subsequently, as illustrated in FIG. 8, anisotropic dry etching is subjected to insulating film 15 to form side wall 16 being remnants of insulating film 15 on the side surface of heater electrode 14, and insulating film 15 at the tip end of heater electrode 14 is removed. As a result, heater electrode 14 has a configuration with its tip end exposed alone.

Subsequently, as illustrated in FIG. 9, phase change material layer 17 and upper electrode 18 are sequentially deposited. More specifically, as the phase change material, chalcogenide material may be used, for example. "Chalcogenide material" means alloy containing one or more of germanium (Ge), stibium (Sb), tellurium (Te), indium (In), selenium (Se) and the like. Examples of chalcogenide material include binary alloys such as GaSb, InSb, InSe $Sb_2Te_3$ and GeTe, ternary alloys such as $Ge_2Sb_2Te_5$, InSbTe, GaSeTe (GST), $SnSb_2Te_4$ and InSbGe, and quaternary alloys such as AgInSbTe, (GeSn)SbTe GeSb(SeTe) and $Te_{81}Ge_{15}Sb_2S_2$.

As upper electrode 18, titanium (Ti), titanium nitride (TiN) or laminated layer film of titanium and titanium nitride may be used, for example.

Thereafter, protective insulating film is formed on upper electrode 18, or an upper wiring layer is further formed, whereby the fabrication of the inventive PRAM memory cell is completed.

According to the structure of the present exemplary embodiment, the area of contact between phase change material layer 17 and heater electrode 14 is reduced, so the current density increases, allowing more efficient heating of phase change material layer 17. Also, since the area of contact between phase change material layer 17 and heater electrode 14 decreases, the spreading width of the region (reference numeral 19 of FIG. 9) where phase change occurs can be suppressed. Accordingly, in addition to the improvement of heating efficiency of the heater electrode, the phase change region is reduced, so phase change can be accomplished using smaller heat quantity than related art. Consequently, current consumption can be significantly suppressed. Also, phase change can be made by smaller current ability of the memory cell transistor, allowing reduction in transistor size and reduction in chip area.

A second exemplary embodiment will be described with reference to FIGS. 10 to 12.

First, the steps of FIGS. 1 to 6 according to the first exemplary embodiment are similarly performed.

Figure 10:
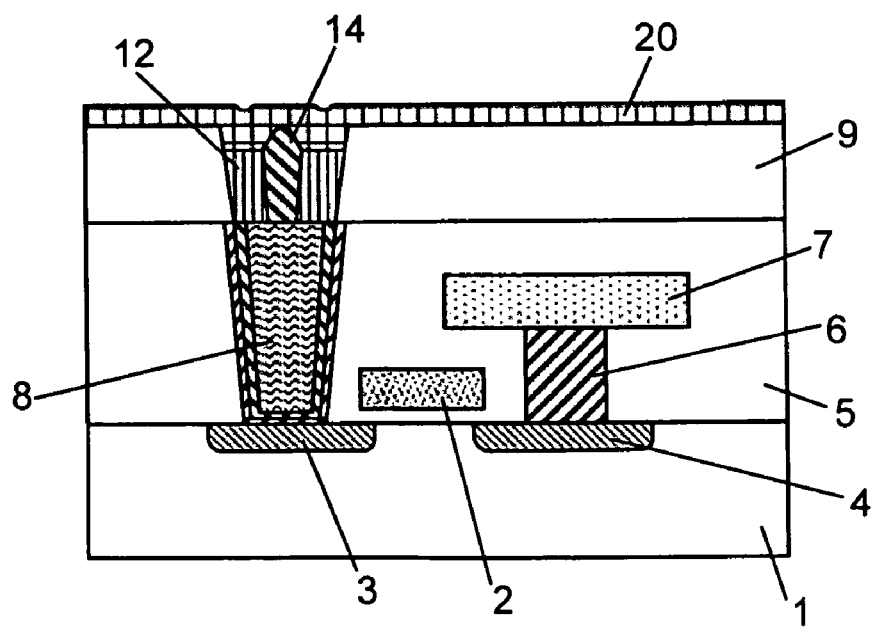
FIGS. 10 and 11 are each a sectional view for describing steps in a fabrication method of a phase change memory device according to another exemplary embodiment of the present invention.

Subsequently, as illustrated in FIG. 10, insulating film 20 of a second insulating material such as silicon nitride is deposited 30 nm or more to completely fill the recess on side wall 12 formed in the step of FIG. 6.

Figure 11:
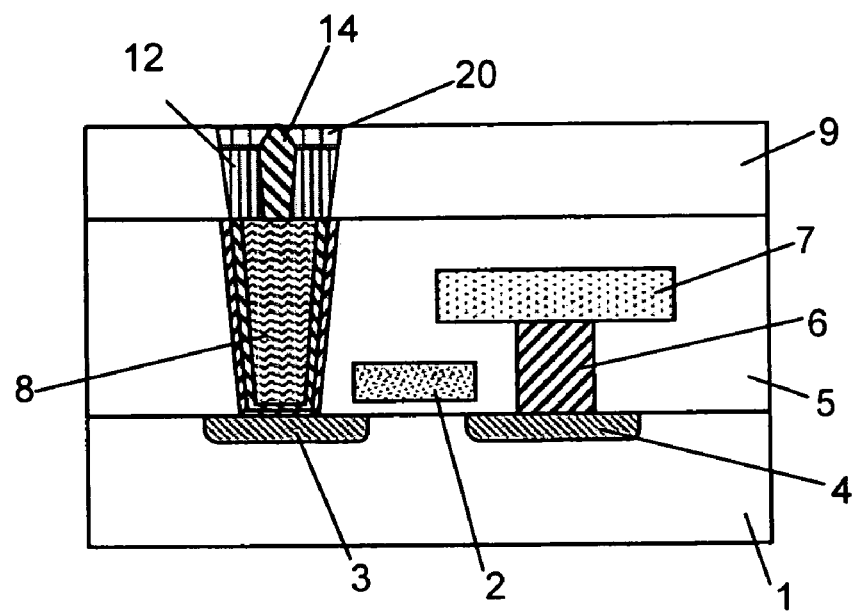

Subsequently, as illustrated in FIG. 11, insulating film 20 is polished by dry etching or CMP to expose only the tip end of heater electrode 14.

Figure 12:
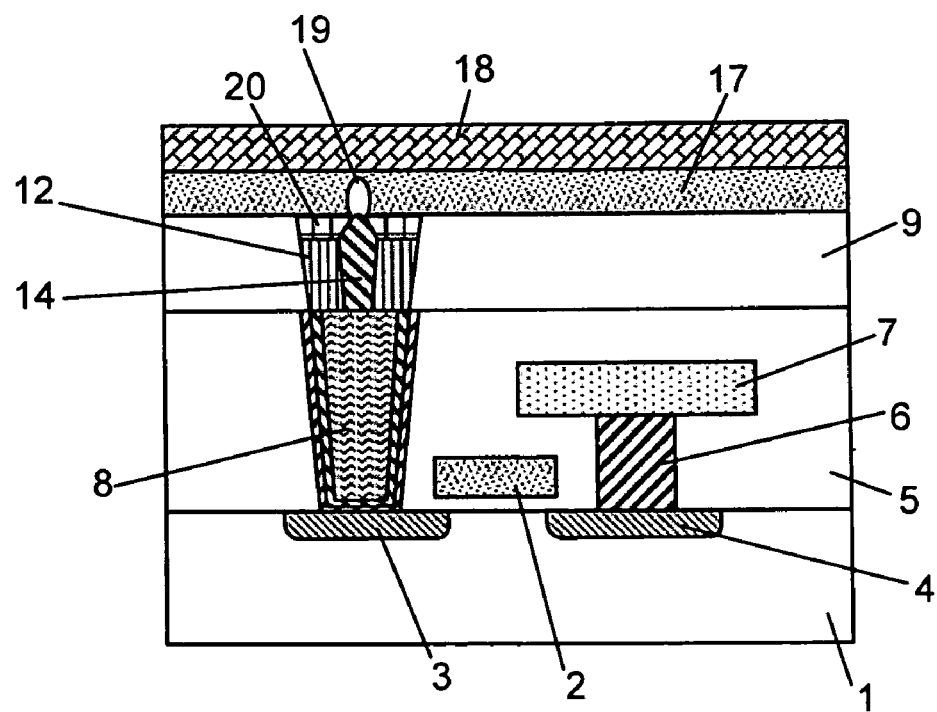
FIG. 12 is a sectional view for describing the phase change memory device according to another exemplary embodiment of the present invention.
Figure 13:
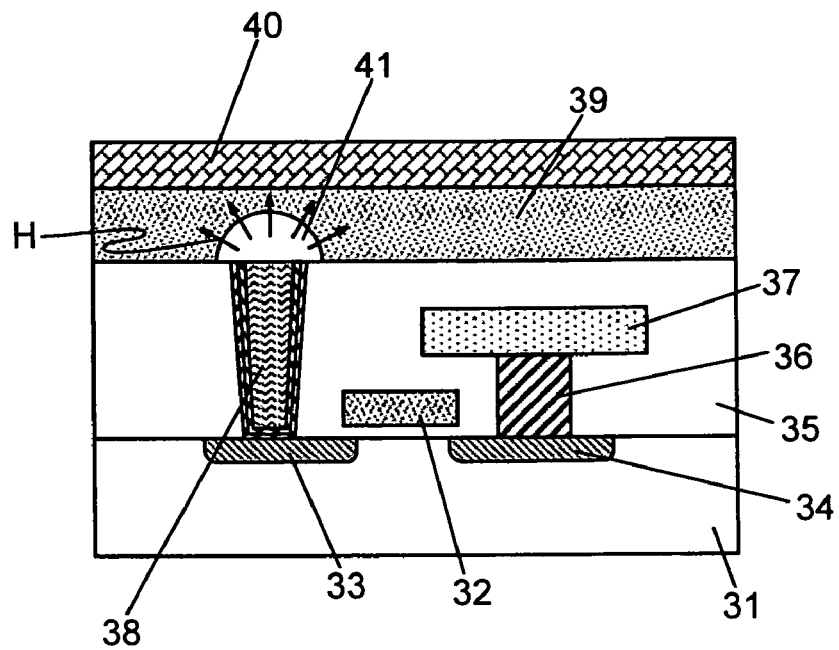
FIG. 13 is a sectional view of a phase change memory device according to a first related art.
Figure 14:
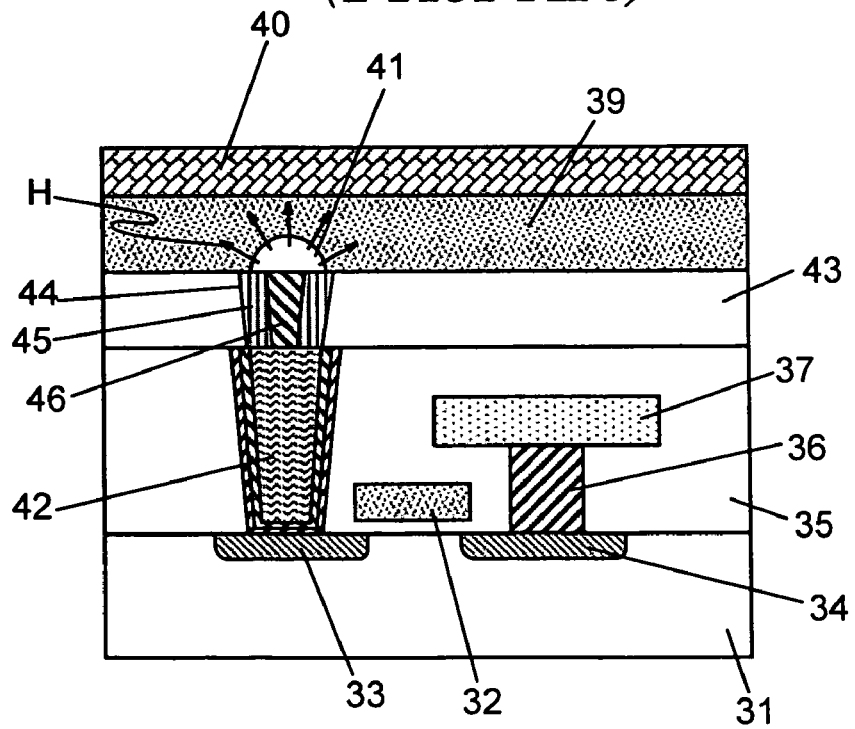
FIG. 14 is a sectional view of a phase change memory device according to a second related art.

Thereafter, as illustrated in FIG. 12, phase change material layer 17 and upper electrode 18 are sequentially deposited, whereby a structure according to the second exemplary embodiment is provided.

According to the exemplary embodiment, similarly to the first exemplary embodiment, phase change material layer 17 is in contact with heater electrode 14 only at the sharp tip end of heater electrode 14. Consequently, the contact area is reduced compared to related art, so the current density increases, allowing more efficient heating of phase change material layer 17 by use of smaller current.

A third exemplary embodiment will be described. According to the first and second exemplary embodiments, tungsten is used for both the material forming the upper layer of contact plug 8 and the material forming the heater electrode. According to the third exemplary embodiment, in order to raise the heating efficiency of the heater electrode, a higher-resistant material may be alternatively used only for the heater electrode.

More specifically, instead of tungsten, titanium nitride (TiN) may be used, for example. The heat generation of the heater electrode increases in proportion to the resistance value of heater electrode. Accordingly, when titanium nitride of a higher resistance value than tungsten is used, a desired heater temperature can be provided by a smaller current. A high-resistant material other than titanium nitride may be used for both the first exemplary embodiment and the second exemplary embodiment.

The processing for sharpening the upper part of the heater electrode is implemented by properly setting the conditions for etching side wall 12 depending on the electrode material used.

In the above described exemplary embodiments, the materials used and other conditions can be changed without departing from the gist of the invention.

For example, a structure may be used in which n-type well is formed in the p-type semiconductor substrate and an MOS transistor is arranged in the n-type well, and impurity such as boron is used in the source and drain region to form a p-type Mos transistor. Further, as the phase change material, any material for which the resistance is varied by heating may be used; thus a material other than chalcogenide may be used.

For both the first insulating material forming side wall 12 and the second insulating material (15, 20) formed around the sharp configuration of the upper part of the heater electrode, silicon nitride film was used, but the present invention is not limited thereto; for example, silicon oxide film used for the interlayer insulating film may also be used for the second insulating material.

Further, the present invention relates to a fabrication method for the phase change memory device. The fabrication method is used for the phase change memory device comprising a phase change material layer and a heater electrode to heat the phase change material layer and thereby varying the resistance value of the phase change material layer to store data. The fabrication method includes:

(a) forming an interlayer insulating film on a semiconductor substrate;

(b) forming an opening in the interlayer insulating film;

(c) forming a side wall made of a first insulating material in a side surface of the opening;

(d) filling a void surrounded by the side wall with a heater electrode material;

(e) performing planarization so that an upper surface of the side wall is exposed;

(f) removing a part of the exposed side wall to form a recess on an upper surface of the interlayer insulating film, and making an upper part of the heater electrode material protrude from the upper surface of the side wall, and also sharpening the heater electrode material toward the upper end thereof to form a heater electrode;

(g) forming a second insulating material as film on the whole surface and thereafter exposing a part of the tip end of the heater electrode; and (h) sequentially forming a phase change material layer and an upper electrode.

Particularly, the second insulating material can be formed as film having a thickness such that the recess is not completely filled, and can be formed in a configuration of side wall on a side surface of the sharp configuration when a part of the tip end of the sharp configuration is exposed.

Preferably, the second insulating material is formed as film to completely fill the recess and is flattened, whereby a part of the tip end of the sharp configuration is exposed.

The process (f) is preferably for etching the interlayer insulating film, the first insulating material and the heater electrode all at once, and the etching is preferably carried out under conditions that the etching speed for the first insulating material is higher than that for the interlayer insulating film, and the etching speed for the heater electrode is higher than that for the interlayer insulating film and lower than that for the first insulating material.

The void is preferably smaller in width. relative to the resolution of photolithography.

The fabrication method can further include forming a contact plug before the process (a), wherein in the process (b), the opening is formed so that at least a part of the upper surface of the contact plug is exposed.

The heater electrode is preferably made of a material having a higher resistance than the contact plug.

The fabrication method can further include forming an MOS transistor, wherein the contact plug is connected to either a source or drain region of the MOS transistor.

What is claimed is:

1. A phase change memory device comprising:
   a phase change material layer;
   a heater electrode having a lower part and an upper part, and the lower part surrounded by a first insulating layer and the upper part protruding the first insulating layer and having a sharp configuration and a tip end coupled to the phase change material layer.

2. The phase change memory device according to claim 1, further comprising a second insulating layer covering the upper part without the tip end.

3. The phase change memory device according to claim 2, wherein the second insulating layer is formed on a whole upper surface of the first insulating layer.

4. The phase change memory device according to claim 1, further comprising a contact plug coupled between a bottom of the heater electrode and an active switching device and an upper electrode in contact with an upper surface of the phase change material layer.

5. The phase change memory device according to claim 4, wherein the heater electrode includes a material having a higher resistance than that of the contact plug.

6. The phase change memory device according to claim 4, wherein the active switching device is a transistor, the contact plug is connected to one of a source region and drain region of the transistor, and the other region of a source region and drain region of the transistor is connected to a wiring layer supplied ground potential.

7. The phase change memory device according to claim 1, further comprising a third insulating layer covering a side surface of the first insulating layer and a side surface of the second insulating layer.

8. The phase change memory device according to claim 7, wherein the third insulating layer has a height higher than that of the first insulating layer and the second insulating layer has an upper surface, and a level of the upper surface of the second insulating layer is lower than that of the third insulating layer.

9. The phase change memory device according to claim 7, wherein the third insulating layer has a height higher than that of the first insulating layer and the second insulating layer has an upper surface, and a level of the upper surface of the second insulating layer is substantially equal to that of the third insulating layer.

* * * * *